United States Patent [19]
Ando et al.

[11] Patent Number: 5,400,242
[45] Date of Patent: Mar. 21, 1995

[54] MULTI-SERIES INVERTER ARRANGEMENT

[75] Inventors: Takeshi Ando; Akira Horie; Yoshio Tsutsui, all of Katsuta, Japan

[73] Assignee: Hitachi, Ltd., Tokyo, Japan

[21] Appl. No.: 21,671

[22] Filed: Feb. 24, 1993

[30] Foreign Application Priority Data

Feb. 27, 1992 [JP] Japan .................. 4-076075

[51] Int. Cl.[6] .......................... H02M 7/521
[52] U.S. Cl. ........................ 363/136; 363/58
[58] Field of Search ............. 363/56, 57, 58, 135, 363/136, 137; 307/630, 633, 634

[56] References Cited

U.S. PATENT DOCUMENTS

| | | | |
|---|---|---|---|
| 4,698,739 | 10/1987 | Paice | 363/71 |
| 4,853,836 | 8/1989 | Furuhashi | 363/58 |
| 4,926,306 | 5/1990 | Ueda et al. | 363/137 |
| 5,031,088 | 7/1991 | Tanaka | 363/136 |

FOREIGN PATENT DOCUMENTS

| | | | |
|---|---|---|---|
| 0321865 | 12/1988 | European Pat. Off. | 363/136 |
| 3430308 | 8/1984 | Germany | 363/136 |
| 4113603 | 4/1991 | Germany | 363/136 |
| 4206263 | 2/1992 | Germany | 363/136 |
| 56-74088 | 6/1981 | Japan | H02M 7/537 |
| 2-131370 | 5/1990 | Japan | H02M 7/48 |

*Primary Examiner*—R. Skudy
*Assistant Examiner*—Matthew Nguyen
*Attorney, Agent, or Firm*—Antonelli, Terry, Stout & Kraus

[57] ABSTRACT

In a multi-series inverter arrangement comprising a DC circuit including a neutral point output terminal and a multi-series inverter including three series connections of first through fourth GTOs, each connected in parallel with the DC circuit, the juncture of the first and second GTOs and the juncture of the third and fourth GTOs being connected to the neutral point output terminal via respective clamping diodes and the first and third GTOs and the second and fourth GTOs being on and off controlled each other in a conjugate relationship, individual gate driving circuits for the second and third GTOs being designed to provide a larger gate current, in particular, a larger wide width gate forward current to the corresponding GTOs than that provided by individual gate driving circuits for the first and fourth GTOs to the corresponding GTOs.

7 Claims, 12 Drawing Sheets

|       | S1 ON     | S3 ON |
|-------|-----------|-------|
| S2 ON | +E        | 0     |
| S4 ON | INHIBITED | −E    |

| S1 | OFF | ON | OFF | OFF | OFF |
|---|---|---|---|---|---|
| S2 | ON | ON | ON | OFF | ON |
| S3 | ON | OFF | ON | ON | ON |
| S4 | OFF | OFF | OFF | ON | OFF |
| OUTPUT VOLTAGE | 0 | E | 0 | -E | 0 |
| SWITCHING CONDITION | (1) | (2) | (1) | (3) | (1) |
| CHANGE OF SWITCHING CONDITION | | ① | ② | ③ | ④ |

PRIOR ART FIG. 7

MULTI-SERIES INVERTER ARRANGEMENT

BACKGROUND OF THE INVENTION

1. Field of the Invention

The present invention relates to a multi-series inverter arrangement and, in particular, relates an improvement in a gate driving circuit in a multi-series inverter arrangement which controls turn on and turn off of switching elements such as gate turn-off thyristers (hereinafter abbreviated as GTO) for a multi-series inverter.

2. Description of Related Art

An example of conventional multi-series inverters is disclosed such as in JP-A-56-74088 (1981). FIG. 1 is a diagram illustrating a main circuit of the multi-series inverter. In the drawing, numeral 11 is a DC power source, and smoothing capacitors 12 and 13 connected in series are connected to the DC power source 11 in parallel. The mutual juncture point of these two smoothing capacitors 12 and 13 is used as a neutral point of the DC power source 11. A switching circuit thereof is constituted by GTOs S1U through S4W, flywheel diodes D1U through D4W and clamping diodes CD1U through CD2W for clamping respective output terminals U, V and W at a neutral potential.

The GTOs S1U through S4W constituting the multi-series inverter are controlled turned on and turned off by on and off signals provided from a control circuit (not shown) and the GTOs S1 and S3, and the GTOs S2 and S4 are designed to operate respectively as a set of inverters and are controlled to turn on and turn off in a conjugate relationship with each other. As a result, the output voltage at the output terminals of the multi-series inverter is controlled depending upon the on condition of the respective switching elements as illustrated in FIG. 2. For example, noting U phase, when the switching elements S1U and S2U are turned on (and the switching elements S3U and S4U are turned off), the potential at the output terminal U is rendered at $+E$. Contrary thereto, when the switching elements S3U and S4U are turned on (and the switching elements S1U and S2U are turned off), the potential at the output terminal U is rendered at $-E$. Further, when the switching elements S2U and S3U are turned on (and the switching elements S1U and S4U are turned off), the output terminal U is connected to the juncture point of the smoothing capacitors 12 and 13 via the switching elements S2U and S3U and the clamping diodes CD1U and CD2U, and is fixed at zero potential of the power source neutral point. Simultaneous turn on of the switching elements S1U and S4U is inhibited. As a result of the above explained operation of the switching circuit, potential at the output terminal U varies between $+E$, 0 and $-E$.

FIG. 3 shows a waveform diagram of a gate current supplied to GTOs from a gate driving circuit for turning on the GTOs which is illustrated, for example, on page 24 in "Semiconductor Power Converter Circuit" (edited by Special Committee for Investigating Semiconductor Power Conversion System for the Institute of Electrical Engineers of Japan, 1987). When an on signal is applied to a GTO from a control circuit, at first a high gate drive forward current IFG1 is provided thereto and subsequently a wide width gate forward current IFG2 is provided thereto. Based upon "Characteristics of GTO of 4.5 kV and 2000 A", a reference paper SPC-83-29 prepared by Semiconductor Power Conversion Study Committee for the Institute of Electrical Engineers of Japan, 1983, in case of a GTO of 4.5 kV and 2000 A, for example, IFG1=25 A and IFG2=2 A are proposed. Accordingly, a gate driving circuit is constituted in such a manner that when an on signal is applied thereto the gate driving circuit causes a high gate drive forward current IFG1 to flow until the GTO is turned on and thereafter a wide width gate forward current IFG2 is caused to flow until the signal from the control circuit is changed into an off signal.

FIG. 4 shows an example of gate driving circuits which cause the gate current to flow as illustrated in FIG. 3. When an on signal is applied thereto, a switch SW1 is closed. As a result, electric charges stored in the capacitor C via a resistor R1 are discharged via a resistor R2 and are provided to the GTO as a high gate drive forward current IFG1 and subsequently a wide width gate forward current IFG2 is provided thereto from an on power source E1. When turning off the GTO, the switch SW1 is opened and a switch SW2 is closed to reverse bias the GTO with an off power source E2. As will be apparent from FIG. 3, the high gate drive forward current IFG1 cannot be caused to flow except for the moment when an on signal is applied. Further, switching elements such as transistors and FETs are used for the switches SW1 and SW2.

A reason, which necessitates a large gate current such as the high gate drive forward current when a GTO is required to be turned on, is that if the gate current is small at the moment when a current suddenly begins to flow through the GTO, areas of an on condition do not easily expand over the GTO and a current concentration therein is induced which likely causes a breakdown of the GTO.

Accordingly, for a GTO through which no current flows although an on signal is applied thereto, a high gate drive forward current has to be theoretically provided at the moment when a current begins to suddenly flow depending upon the circuit condition. However, in the conventional gate driving circuit no current except for the wide width gate forward current can be caused to flow at the moment. For this reason, under these conditions even if a current tends to flow suddenly, the GTO likely turns off at once due to insufficient on condition thereof and there arises a problem that a voltage between the anode and cathode of the GTO is induced. Such problem is particularly significant with regard to a high speed GTO having a short turn off time. Hereinbelow, this phenomenon is explained in detail with reference to drawings.

FIG. 5 is a circuit diagram showing only a portion for one phase of the multi-series inverter illustrated in FIG. 1. In the multi-series inverter, the GTOs S1 and S3 and the GTOs S2 and S4 are respectively operated to turn on and turn off in a conjugate relationship with each other as a set of inverter, therefore as illustrated in FIG. 6 there exists three kinds of switching conditions (1)~(3) of the GTOs S1 through S4 and four kinds of changes in switching conditions ① through ④. Among these changes in switching conditions a phenomenon, wherein the GTO tends to turn off, in other words, a phenomenon that a voltage is induced at the GTO (hereinafter called as "incomplete on phenomenon") because the GTO is not sufficiently moved into an on condition when a current having a high di/dt (which will be explained later in detail) flows through the GTO, is caused under the following two conditions.

The first one is caused under a condition that the GTOs S1 and S2 in FIG. 5 are in an on condition (the condition (2) in FIG. 6) and a load current is flowing through the flywheel diodes D1 and D2 in the direction of an arrow 15 in FIG. 5 when the GTO S1 is turned off and the GTO S3 is turned on (the change in switching condition ②) in FIG. 6), and the other is caused under a condition that the GTOs S3 and S4 are in an on condition (the condition (3) in FIG. 6) and a load current is flowing through the flywheel diodes D3 and D4 in the direction of an arrow 16 in FIG. 5 when the GTO S4 is turned off and the GTO S2 is turned on (the change in switching condition ④). These two changes in switching conditions are hereinafter called respectively as mode 1 and mode 2.

Current flows during the mode 1 are illustrated in FIG. 7. When the GTO S1 is turned off and the GTO S3 is turned on, the load current flowing through the flywheel diodes D1 and D2 is commutated toward the GTO S3 and the clamping diode CD2 in the direction of an arrow 21 and a current from the smoothing capacitor 12 flowing through the flywheel diode D1 for recovering the same and a snubber circuit 20 for the GTO S1 as shown by arrow 22 flows through the GTO S2. This current, as indicated by arrow 22, is one which builds up suddenly at a di/dt of about 100 A/$\mu$s and is caused to flow through the GTO S2 through which no current has flowed until that moment although an on signal has been provided thereto. FIG. 8 shows a voltage waveform induced between the anode and gate of the GTO S2 and the current waveform thereof at that moment. As seen from the drawing a voltage is induced at the GTO S2 and the induced voltage $\Delta V$ when di/dt is 100 A/$\mu$s reaches upto 200 V. Such voltage induction leads to an increase of switching element damage and, in some cases, leads to a breakdown of the switching elements which is undesirable.

Current flows during the mode 2 are illustrated in FIG. 9. When the GTO S4 is turned off and the GTO S2 is turned on, a load current flowing through the flywheel diodes D3 and D4 is commutated toward the clamping diode CD1 and the GTO S2 in the direction of an arrow 23 and a current from the smoothing capacitor 13 flowing through the flywheel diode D4 for recovering the same and a snubber circuit 20 for the GTO S4 as shown by an arrow 24 flows through the GTO S3. This current as indicated by arrow 24 is one which, like in the mode 1, builds up suddenly at a di/dt of about 100 A/$\mu$s and a voltage as illustrated in FIG. 8 is also induced at the GTO S3. In this instance like in the mode 1, such voltage induction leads to an increase of switching element damage and, in some cases, leads to a breakdown of the switching elements which is undesirable.

Although there was a similar mode in a conventional two level inverter wherein a current begins to flow through a GTO through which no current has flowed until then, nevertheless an on signal is applied thereto, and the current variation was a slow one (di/dt of about 1 A/$\mu$s) which is determined by a load and there arise no such problems.

FIG. 10 shows a relationship between voltage $\Delta V$ induced at GTO due to incomplete on phenomenon and gate current provided thereto using di/dt of a current flowing through the GTO as a parameter. For a gate current 7 A which is flown as a wide width gate forward current in a conventional gate driving circuit, no voltage is induced at the GTO with di/dt=1 A/$\mu$s as seen from FIG. 10, contrary thereto, with di/dt=100 A/$\mu$s a voltage of about 200 V is induced at the GTO.

SUMMARY OF THE INVENTION

An object of the present invention is to provide a gate driving circuit for a multi-series inverter arrangement which prevents generation of an incomplete on phenomenon in switching elements such as GTOs and breakdown thereof.

In the multi-series inverter arrangement according to the present invention having the constitution as shown in FIG. 1, the magnitude of gate current flowing to the gates of GTOs to which an on signal is applied is selected to be larger for the GTOs S2 and S3 located inside than for the GTOs S1 and S4 located outside.

In this instance, among the high gate drive forward current and the wide width gate forward current which flow through the gate of the GTO when an on signal is applied thereto from the gate driving circuit, the conventional magnitude of the wide width gate forward current of about 7 A is increased, for example, up to about 20 A and the increased wide width gate forward current is provided to the gate of the GTO to thereby prevent generation of an incomplete on phenomenon of the GTO.

Further, the GTO gate driving circuit is adapted to output the high gate drive forward current and the wide width gate forward current independently when an on signal is applied thereto, and every time when an incomplete on phenomenon is caused at a GTO, a high gate drive forward current is always provided to the GTO. A signal which causes the high gate drive forward current is formed based upon an output from means detecting the GTO voltage, means detecting gate current flowing through the GTO anode or means detecting the GTO main circuit current, or a logical combination of on signals applied to the respective GTOs.

One aspect of the present invention is to provide a gate driving circuit for a multi-series inverter arrangement which includes a plurality of switching elements and inverts a DC voltage into an AC voltage having three levels of a high potential, an intermediate potential and a low potential wherein, when an incomplete on phenomenon is caused at the switching elements associated with an outputting of the intermediate potential a high gate drive forward current is provided to the associating switching elements.

Another aspect of the present invention is to provide a gate driving circuit for a multi-series inverter arrangement which includes a plurality of switching elements and inverts a DC voltage into an AC voltage having three levels of a high potential, an intermediate potential and a low potential wherein, during a period when the intermediate potential is output, a high gate drive forward current is provided to the switching elements associated with an outputting of the intermediate potential.

Still another aspect of the present invention is to provide a gate driving circuit for a multi-series inverter arrangement which includes four switching elements of first, second, third and fourth switching elements connected in series between both terminals of a DC circuit. The circuit has a neutral point output terminal, a mutual juncture point of the first and second switching elements and a mutual juncture point of the third and fourth switching elements that are connected to the neutral point output terminal of the DC circuit via respective clamping diodes. The first and third switching elements and the second and fourth switching elements are on and off controlled with each other in a conjugate relationship wherein, the second and third switching elements are provided with a larger gate current including a high gate drive forward current and a wide width gate forward current than those provided for the first and fourth switching elements, and, in particular, a larger wide width gate forward current is provided to the second and third switching elements.

A further aspect of the present invention is to provide a gate driving circuit for a multi-series inverter arrangement which includes four switching elements of first, second, third and fourth switching elements connected in series between both terminals of a DC circuit. The circuit has a neutral point output terminal, a mutual juncture point of the first and second switching elements and a mutual juncture point of the third and fourth switching elements that are connected to the neutral point output terminal of the DC circuit via respective clamping diodes. The first and third switching elements and the second and fourth switching elements are on and off controlled with each other in a conjugate relationship wherein, when an incomplete on phenomenon is induced at the second and third switching elements, a high gate drive forward current being are provided for the second and third switching elements.

A still further aspect of the present invention is to provide a gate driving circuit for a multi-series inverter arrangement which includes four switching elements of first, second, third and fourth switching elements connected in series between both terminals of a DC circuit. The circuit has a neutral point output terminal, a mutual juncture point of the first and second switching elements and a mutual juncture point of the third and fourth switching elements that are connected to the neutral point output terminal of the DC circuit via respective clamping diodes. The first and third switching elements and the second and fourth switching elements are on and off controlled with each other in a conjugate relationship wherein, a flywheel diode is connected for the respective first, second, third and fourth switching elements and when a load current is in a flywheel mode, a high gate drive forward current is provided for the second and third switching elements.

A still further aspect of the present invention is to provide a gate driving circuit for a multi-series inverter arrangement which includes four switching elements of first, second, third and fourth switching elements connected in series between both terminals of a DC circuit. The circuit has a neutral point output terminal, a mutual juncture point of the first and second switching elements and a mutual juncture point of the third and fourth switching elements that are connected to the neutral point output terminal of the DC circuit via respective clamping diodes. The first and third switching elements and the second and fourth switching elements are on and off controlled with each other in a conjugate relationship wherein, the second and third switching elements are respectively provided with a snubber circuit connected in parallel therewith. A capacitor is also included having a predetermined capacitance which bypasses a large current flowing through a main circuit in the inverter arrangement when an incomplete on phenomenon is caused at the second and third switching elements, and limits a voltage induced across the corresponding switching element below a predetermined voltage which never breaks down the corresponding switching element.

Still further aspect of the present invention is to provide a gate driving circuit for a multi-series inverter arrangement which includes a DC circuit. The circuit has n DC power sources connected in series, wherein the DC power source located at the most positive side is designated as the first DC power source; (n+1) output terminals; 2n switching elements connected in series, wherein the switching element located at the most positive side is designated as the first switching element; a positive side terminal for the first DC power source connected to the first switching element; a negative side terminal for the nth DC power source connected to the 2nth switching element; an inverter output terminal connected to a mutual juncture point of the nth and (n+1)th switching elements and (i+1)th output terminal for the DC circuit being connected to the mutual juncture point of the ith and (i+1)th switching elements as well as juncture point of the (n+i)th and (n+i+1)th switching elements via respective clamping diodes wherein i is from 1 to n−1, and the ith and (n+i)th switching elements being on and off controlled in a conjugate relationship wherein i is from 1 to n wherein, among the 2n switching elements magnetude of the gate current which is provided for the second switching element through the (2n−1)th switching element is selected larger than that of the gate current provided for the first and 2nth switching elements.

By providing a wide width gate forward current or a high gate drive forward current which is large enough to turn on the GTOs as a GTO gate current a spreading of an on area within the GTO is hastened even when a current begins to flow suddenly through the GTO such that no high voltage is induced between the anode and cathode of the GTO. Accordingly breakdown of the GTO is prevented.

BRIEF DESCRIPTION OF THE DRAWINGS

FIG. 7 is a diagram showing a load current flow in mode 1 in which an incomplete on phenomenon may be caused at GTO S2;

DETAILED DESCRIPTION OF THE EMBODIMENTS

Hereinbelow, embodiments of the present invention are explained.

Figure 1:
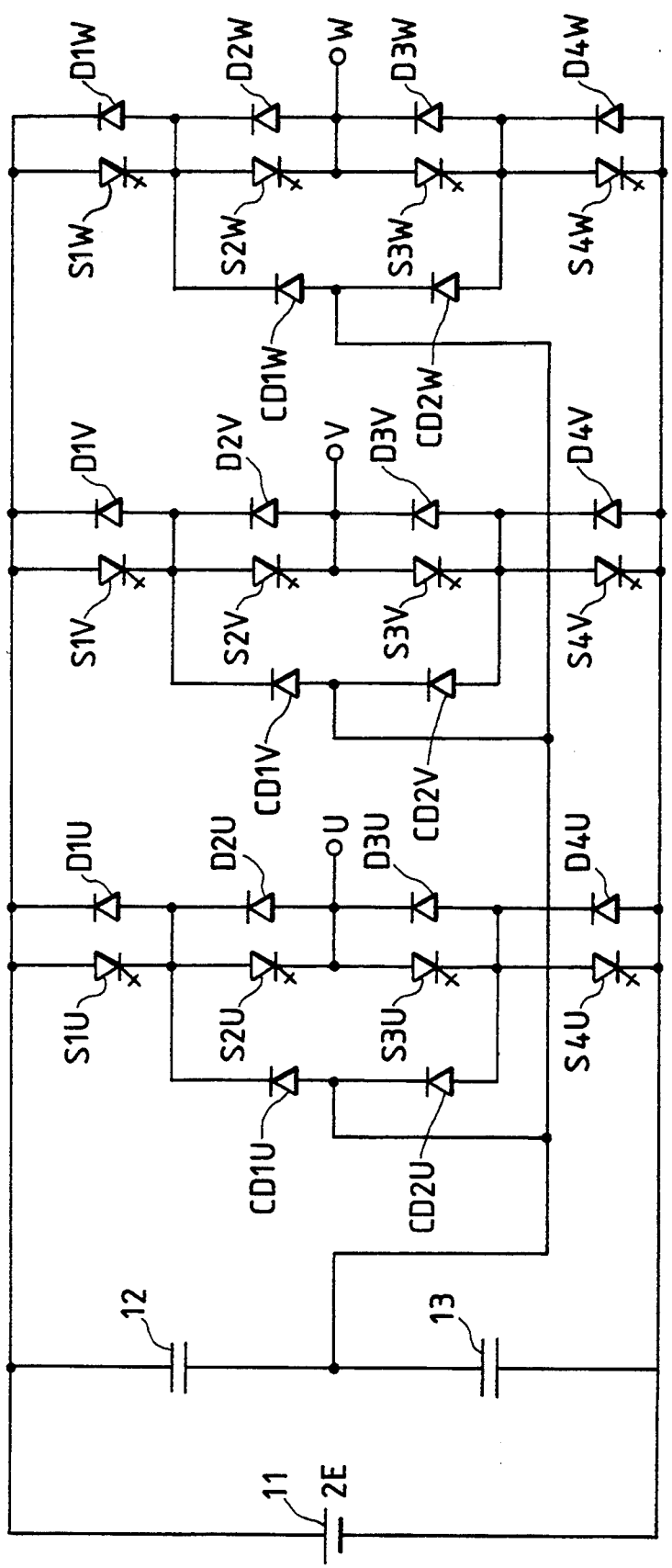
FIG. 1 is a constitutional diagram showing a main circuit of a multi-series inverter to which the present invention is applied.
Figures 2, 3:
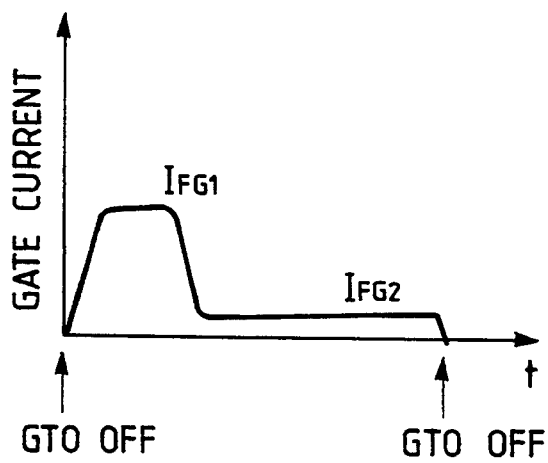
FIG. 2 is a table indicating output voltages of the multi-series inverter depending upon on conditions of switching elements therein.
FIG. 3 is a gate current waveform of GTO in the multi-series inverter.
Figure 4:
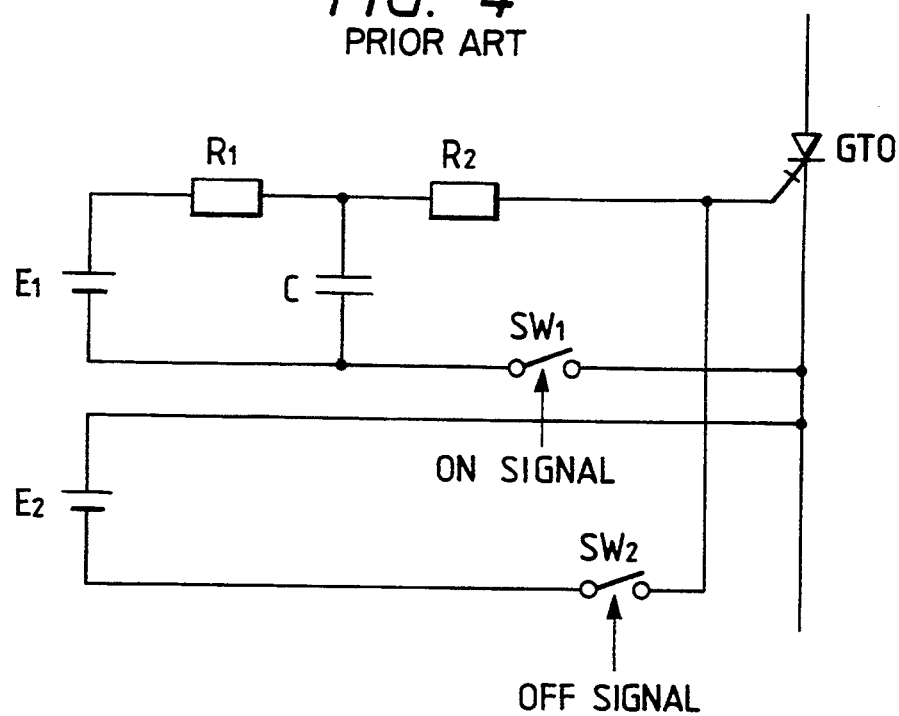
FIG. 4 is a diagram showing a conventional gate driving circuit for the multi-series inverter.
Figure 5:
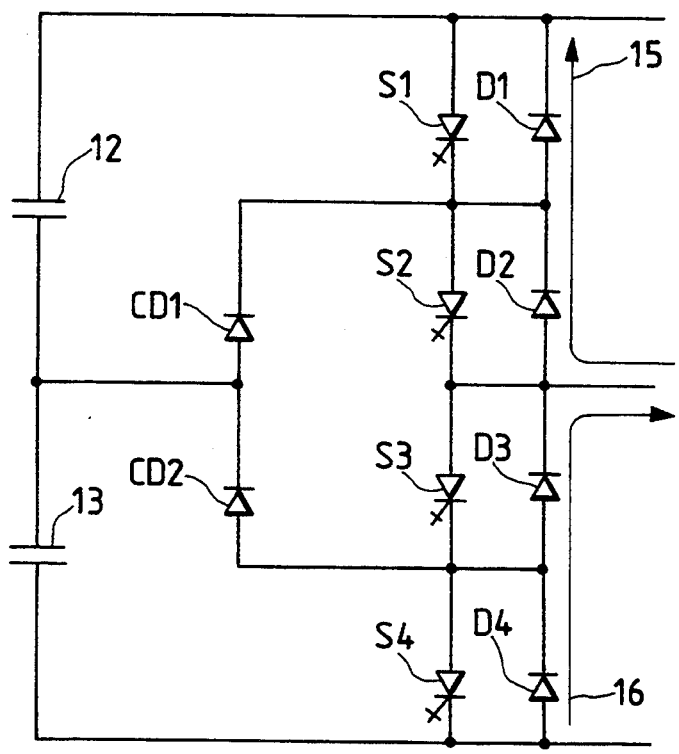
FIG. 5 is a constitutional diagram showing one phase portion in the main circuit of the multi-series inverter.
Figure 6:
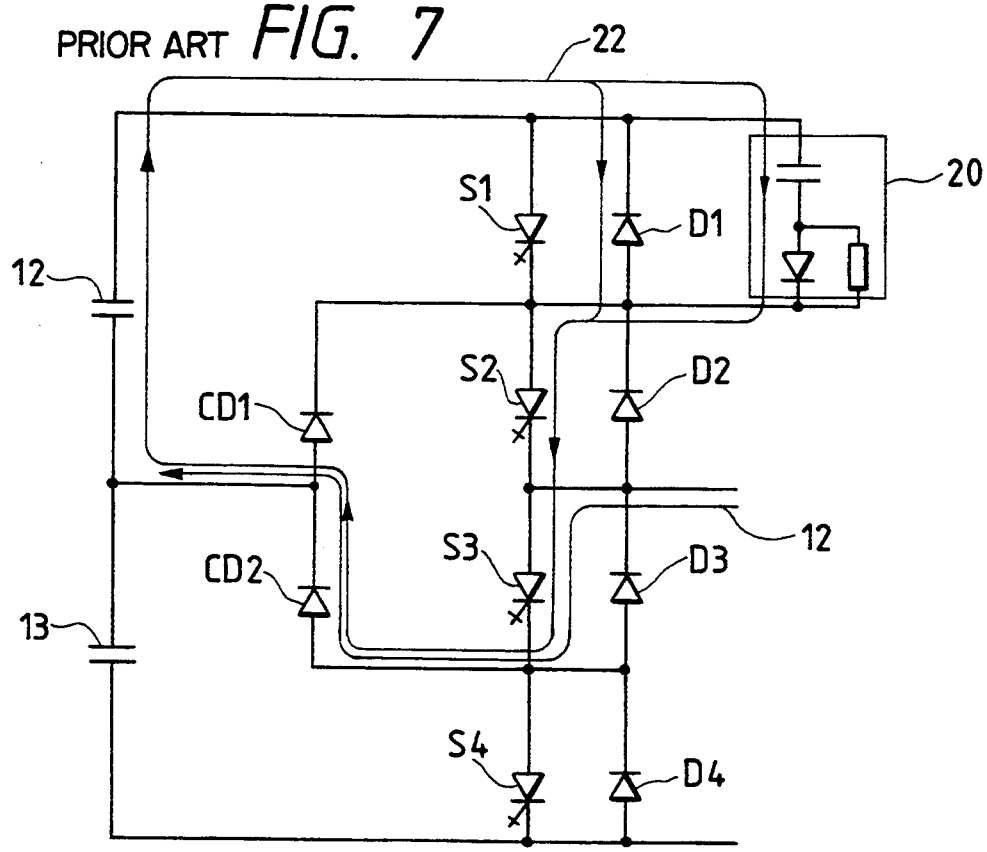
FIG. 6 is a table indicating conditions of the multi-series inverter depending upon switching conditions of respective GTOs therein and changes of the conditions.
Figure 8:
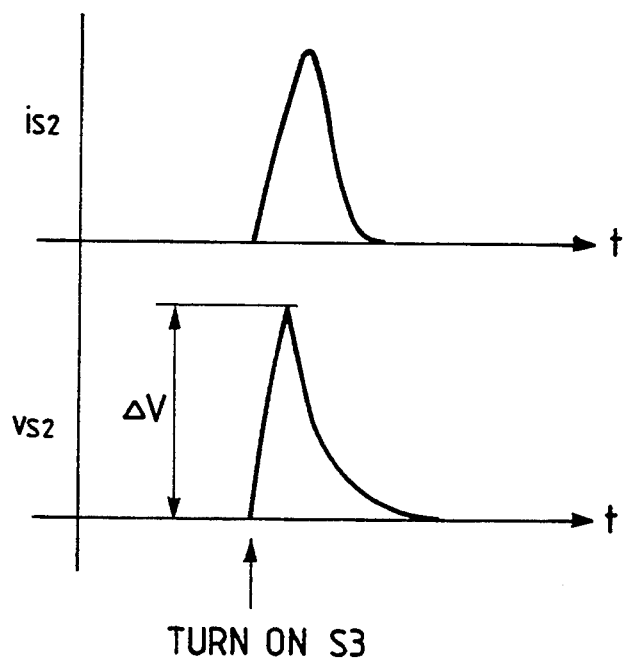
FIG. 8 is voltage and current waveforms induced at GTO S2 when an incomplete on phenomenon is caused.
Figure 9:
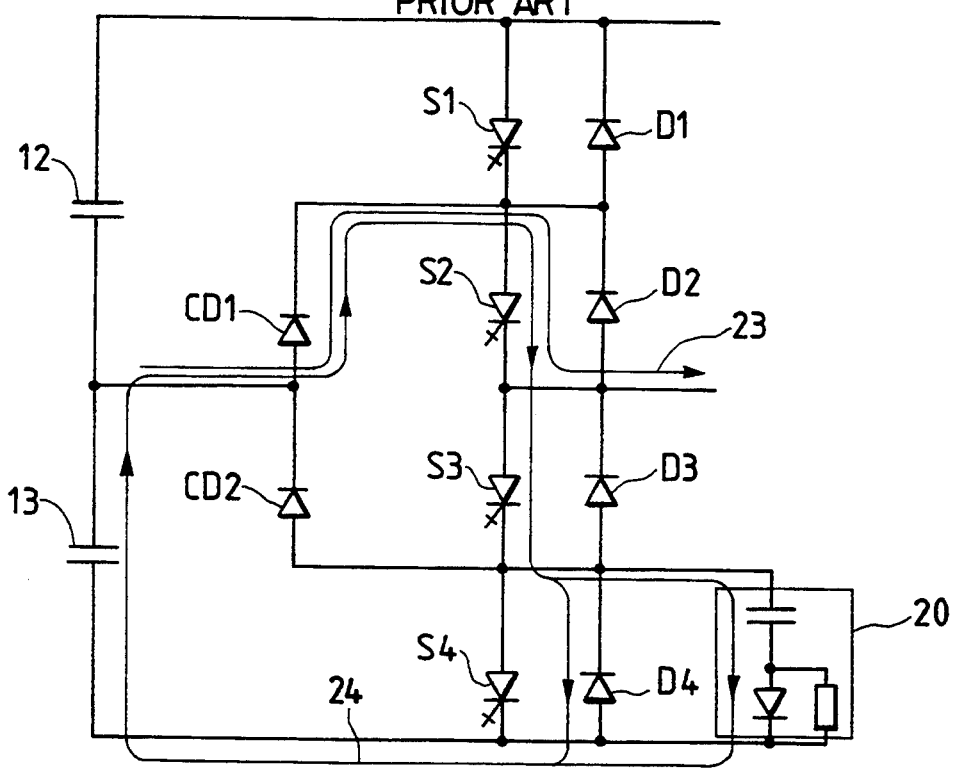
FIG. 9 is a diagram showing a load current flow in mode 2 in which an incomplete on phenomenon may be caused at GTO S3.
Figure 10:
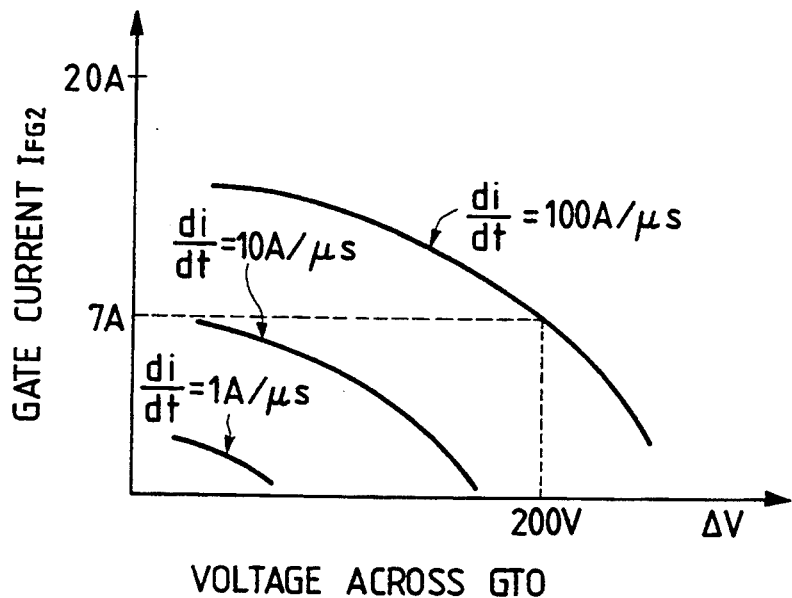
FIG. 10 is a diagram showing a relationship between voltage induced at GTO due to an incomplete on phenomenon and gate current provided thereto.
Figure 11:
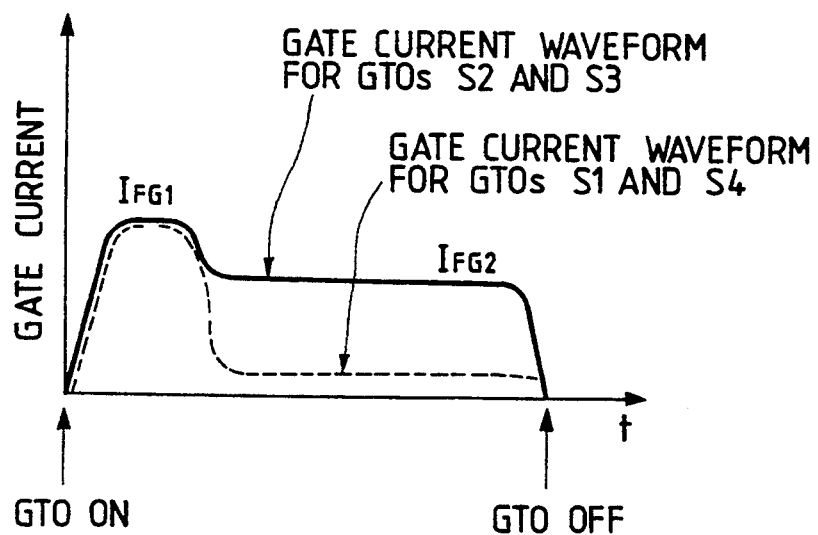
FIG. 11 shows gate current waveforms when an on signal is applied to respective GTOs according to one embodiment of the present invention.

A first embodiment according to the present invention is explained with reference to FIG. 5. In FIG. 5, a GTO gate driving circuit having the same configuration as the conventional one as shown in FIG. 4 is used. However, in the conventional gate driving circuit, a wide width gate forward current IFG2, for example, of about 7 A is usually provided for the GTOs S2 and S3 as well as the GTOs S1 and S4, but contrary thereto, the gate driving circuit of the present embodiment uses a large wide width gate forward current IFG2 of about 20 A. In the gate driving circuit according to the present embodiment, the resistance of the resistor R1 shown in FIG. 4 is selected to be small in comparison with the conventional embodiment. As a result, a large wide width gate forward current IFG2 is provided for the GTOs S2 and S3. On the other hand, the conventional gate driving circuit is used for the GTOs S1 and S4. FIG. 11 shows a difference of gate current waveforms for the GTOs S2 and S3 and for the GTOs S1 and S4. In the drawing, the solid line shows the gate current waveform for the GTOs S2 and S3, and the dotted line shows the gate current waveform for the GTOs S1 and S4. In the present embodiment, a gate current close to the high gate drive forward current always flows through the GTOs S2 and S3 during the time when an on signal is applied to the GTOs as illustrated in FIG. 11, therefore even if a current begins to flow suddenly through the GTOs, an incomplete on phenomenon at the GTOs is prevented to thereby maintain normal operation of the GTOs.

In the present embodiment, an electrical power loss generated in the gate driving circuits is increased in association with the current increase flowing through the gates of the GTOs S2 and S3, however the present embodiment has a feature that a circuit having the same configuration as the conventional gate driving circuit as shown in FIG. 4 can be used.

Figure 12:
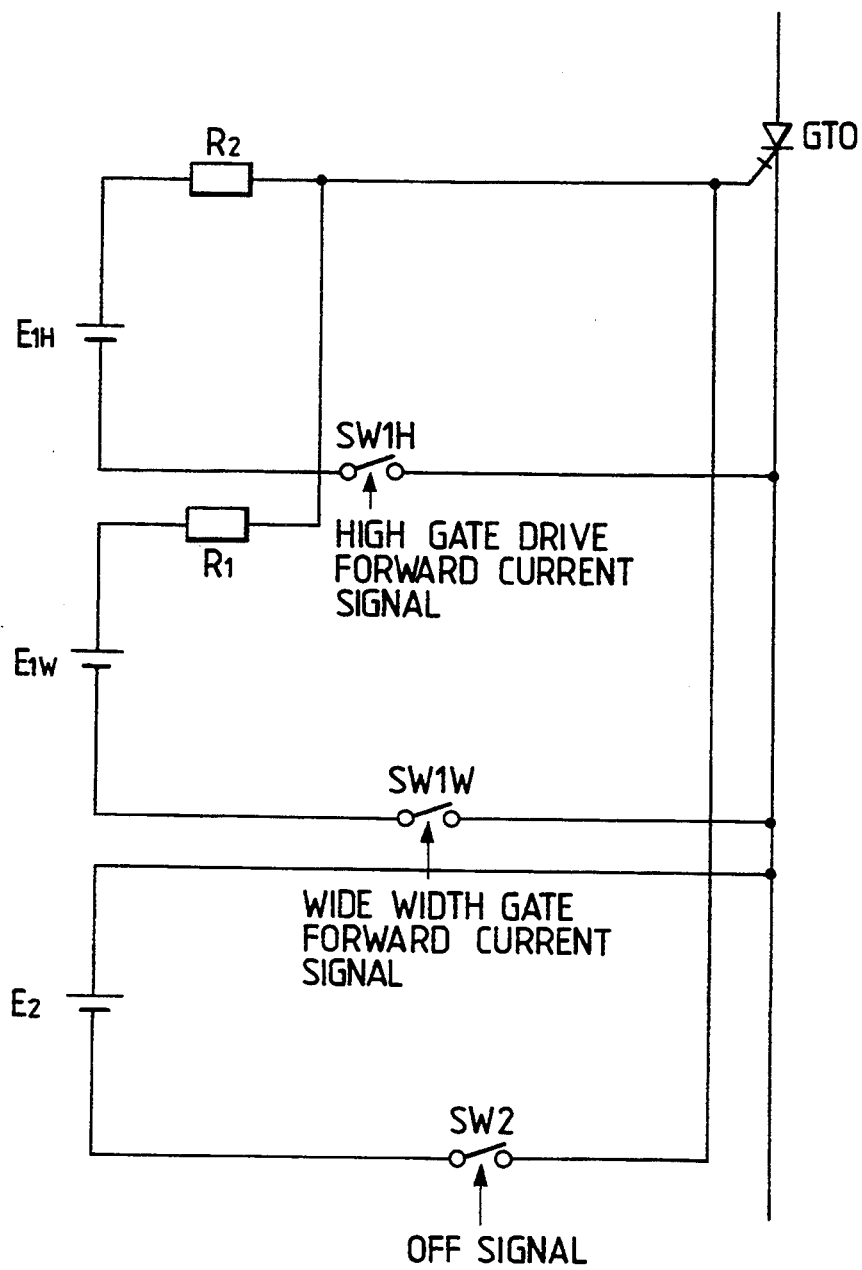
FIG. 12 is a schematic diagram of an embodiment of gate driving circuits in the multi-series inverter arrangement according to the present invention which causes a high gate drive forward current and a wide width gate forward current to flow independently.

Next, FIG. 12 shows a second embodiment according to the present invention. The gate driving circuit shown in FIG. 12 is adapted to provide the high gate drive forward current and the wide width gate forward current independently. In FIG. 12, R1 and R2 are resistors having the same functions as those in FIG. 4, E1H is a power source for the high gate drive forward current, E1W is a power source for the wide width gate forward current, and E2 is a power source for turning off. In the present embodiment, a gate driving circuit which provides the high gate drive forward current and the wide width gate forward current independently is used as the gate driving circuits for the GTOs S2 and S3 in the multi-series inverter. This gate driving circuit provides a wide width gate forward current when an on signal is applied and a switch SW1W is closed, and when a switch SW1H is closed a high gate drive forward current is provided. Accordingly, during the time when the switch SW1H is closed the high gate drive forward current can always flow. The circuit as shown in FIG. 4 is used for the GTOs S1 and S4.

In the present embodiment, it is necessary to separate the signal which causes the high gate drive forward current from the signal which causes the wide width gate forward current so that the gate driving circuit becomes complex in comparison with the circuit shown in FIG. 4, on one hand the large gate current can flow only when it is required such that the present embodiment has a feature that an electrical power loss generated in the gate driving circuit can be decreased.

Now, as methods of preparing the high gate drive forward current signal which is caused only when a large gate current is needed, such methods are conceived as a method of obtaining a signal by detecting a voltage caused by the incomplete on phenomenon of the GTOs, a method of obtaining a signal by detecting a gate current flowing through the anode of the GTOs, a method of obtaining a signal by detecting initiation of current flow through the GTOs and a method of obtaining a signal from a logical combination of on signals provided for the respective GTOs. Hereinafter embodiments of these methods are explained.

Figure 13:
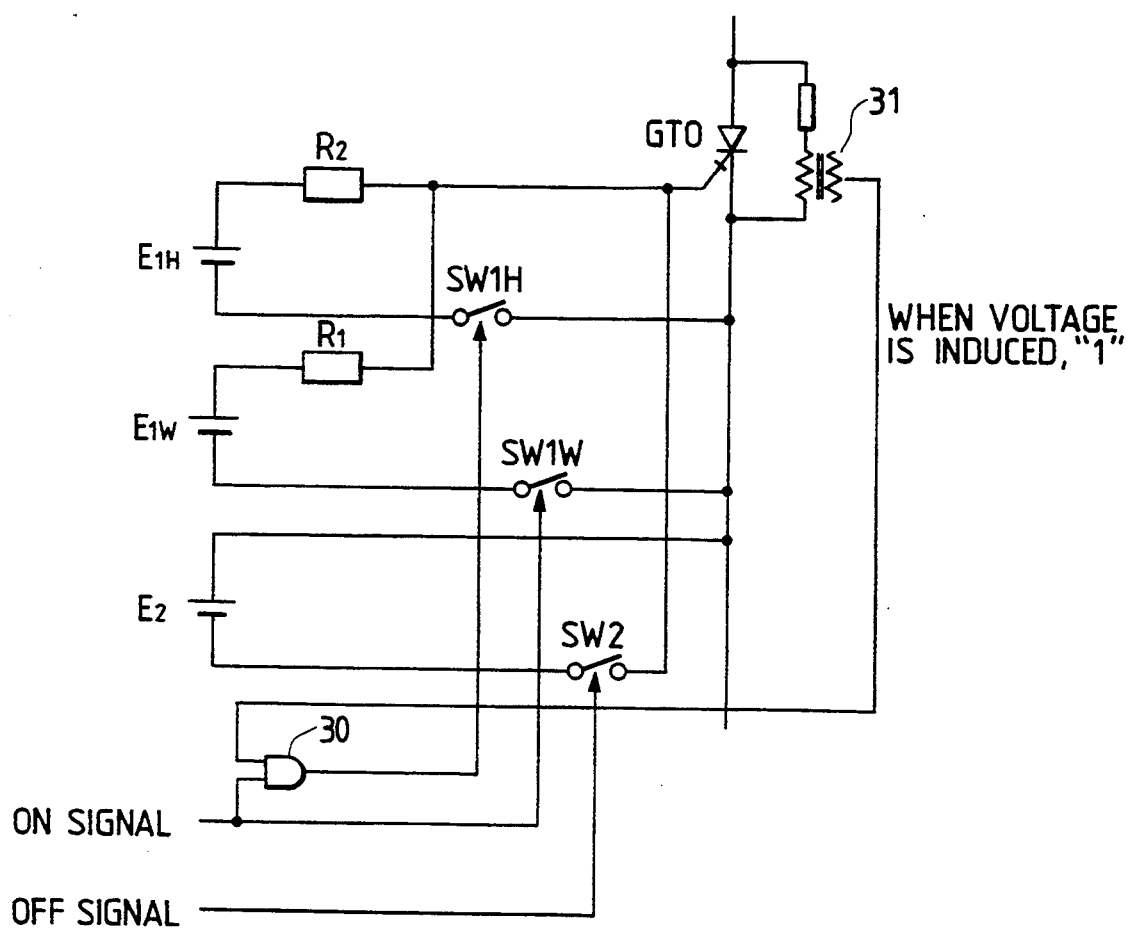
FIG. 13 is a schematic diagram of another embodiment of gate driving circuits in the multi-series inverter arrangement according to the present invention.

FIG. 13 shows a third embodiment according to the present invention. The circuit shown in FIG. 13 is a gate driving circuit wherein a circuit for detecting a voltage at the GTO and a circuit for providing a signal to the switch SW1H are added to the circuit illustrated in FIG. 12. The same on signal as that of the conventional one is applied as it is to the switch SW1W as the wide width gate forward current signal. For preparing a high gate drive forward current signal a voltage detector 31 and an AND operator 30 are introduced. The voltage detector 31 detects a voltage between the anode and cathode of the GTO and generates a signal of "1" when a voltage is induced therebetween. The AND operator 30 generates a signal based upon AND operation of the signal of "1" from the voltage detector 31 and an on signal, and applies the same to the switch SW1H. As a result, the switch SW1H is closed and a high gate drive forward current is caused to flow through the GTO at an instance when an on signal is already applied and an incomplete on phenomenon is caused at the GTO as well as at an instance when the GTO is in an off condition and an on signal is applied thereto. Further, when the GTO is required to be turned off, an off signal is applied to the switch SW2.

With the present embodiment, even if an incomplete on phenomenon tends to be caused at the GTO, the phenomenon is eliminated to thereby prevent breakdown of the GTO.

Figure 14:
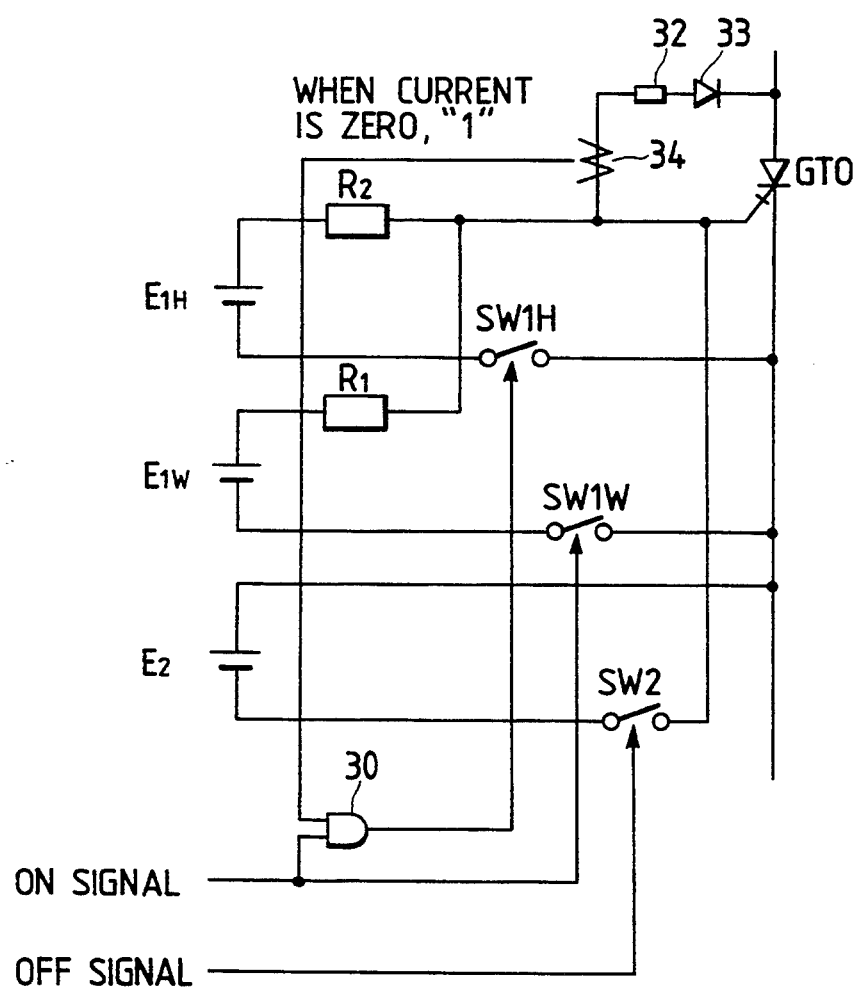
FIG. 14 is a schematic diagram of a still another embodiment of gate driving circuits in the multi-series inverter arrangement according to the present invention.

FIG. 14 shows a fourth embodiment according to the present invention. The circuit shown in FIG. 14 is a gate driving circuit wherein a circuit composed of a resistor 32 and a diode 33 connected between the anode and gate of the GTO and a current detector 34 are provided for detecting an incomplete on phenomenon of the GTO, namely generation of a voltage thereat. Through the circuit to which the current detector 34 is provided a gate current flows during the time when the GTO is turned on, however when an incomplete on phenomenon is caused at the GTO, the GTO is turned off, a voltage is generated between the anode and gate thereof and the flow of the gate current is suppressed. The current detector 34 detects the moment when the gate current is reduced to zero and outputs a signal of "1". The AND operator 30 performs AND operation of the signal of "1" from the current detector 34 and an on signal, and causes to close the switch SW1H. As a result, a high gate drive forward current is provided to the GTO. The other operations of the present embodiment are the same as those explained in connection with the third embodiment.

Figure 15:
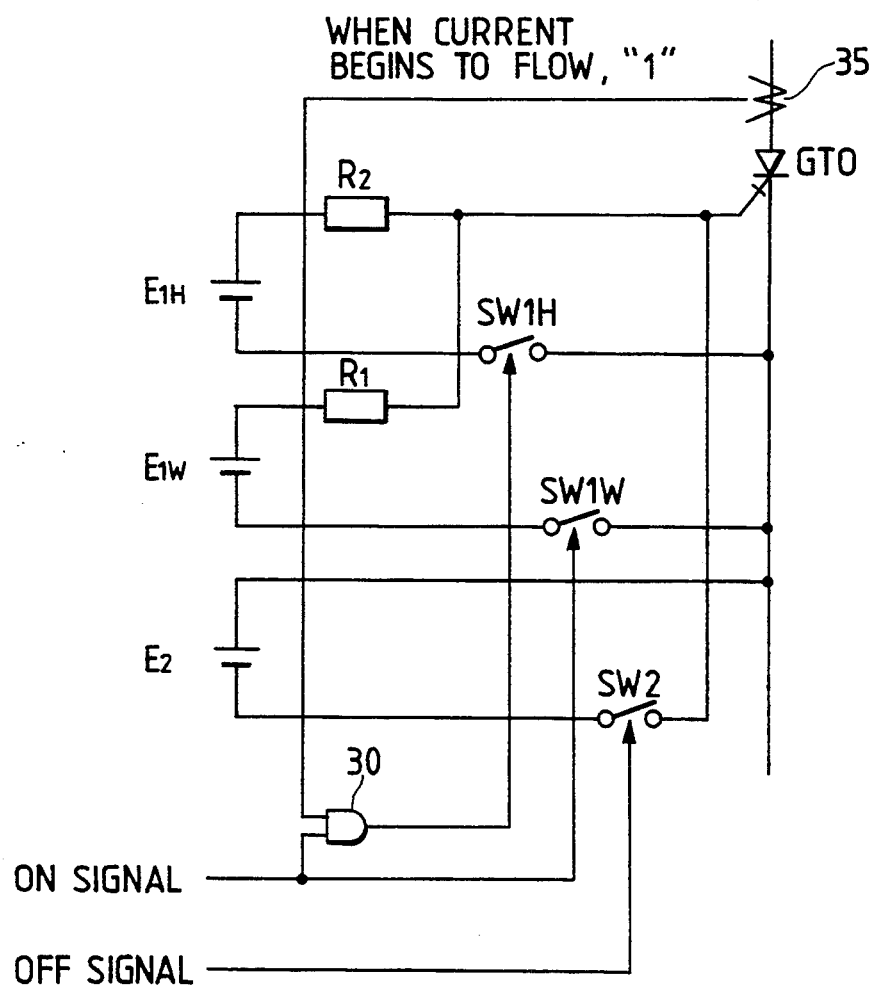
FIG. 15 is a schematic diagram of a further embodiment of gate driving circuits in the multi-series inverter arrangement according to the present invention.

FIG. 15 shows a fifth embodiment according to the present invention. The circuit shown in FIG. 15 is a gate driving circuit wherein a current detector 35 is provided for detecting an anode current of the GTO. When an incomplete on phenomenon is caused at the GTO under a condition that an on signal is applied to the GTO and a wide width gate forward current is provided thereto via the switch SW1W, the current detector 35 detects that an anode current begins to flow and outputs a signal of "1". The AND operator 30 performs AND operation of the signal of "1" from the current detector 35 and an on signal and causes the switch SW1H to close. As a result, a high gate drive forward current is provided to the GTO. The other operations of the present embodiment are the same as those explained in connection with the third embodiment.

Figure 16:
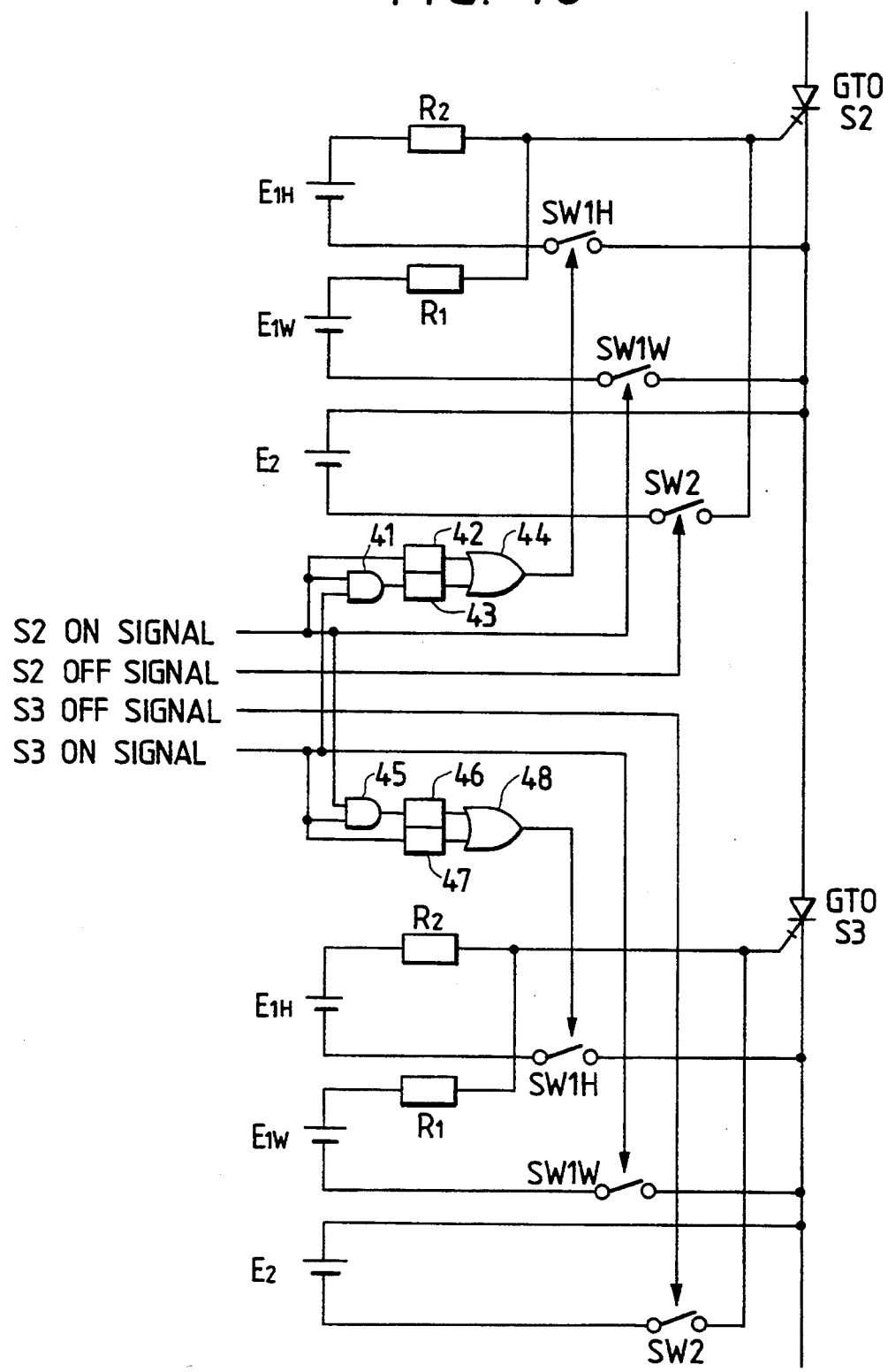
FIG. 16 is a schematic diagram of a still further embodiment of gate driving circuits in the multi-series inverter arrangement according to the present invention.

FIG. 16 shows a sixth embodiment according to the present invention. The circuit shown in FIG. 16 is a gate driving circuit wherein a high gate drive forward current is caused to flow when an on signal is applied to both GTOs S2 and S3 in view of the fact that an incomplete on phenomenon at the GTOs may be caused at the moment when both GTOs S2 and S3 are turned on. In FIG. 16, two gate driving circuits for the GTOs S2 and S3 are illustrated. A high gate drive forward current signal applied to the switch SW1H for causing a high gate drive forward current is provided at the moment when an on signal is applied to both the GTOs S2 and S3, which is detected by an AND operator 41 and an AND operator 45 respectively, by one shot multi-vibrators 43 and 46 via OR operators 44 and 45 until both GTOs S2 and S3 are turned on. Further, in the circuit shown in FIG. 16 at the moment when an on signal is applied only to the GTO S2 a high gate drive forward current signal is provided by the one shot multi-vibrator 42 via the OR operator 44 until the GTO S2 is turned on. The same is true with regard to the gate driving circuit for the GTO S3 through the members 47 and 48.

In the present embodiment, a high gate drive forward current may be provided even when no incomplete on phenomenon is caused, however no voltage or current detector for a main circuit is needed, the present embodiment is realized with a logic circuit using a low voltage, it is a feature of the present embodiment that the circuit is easily realized in comparison with those of the third through fifth embodiments.

Figure 17:
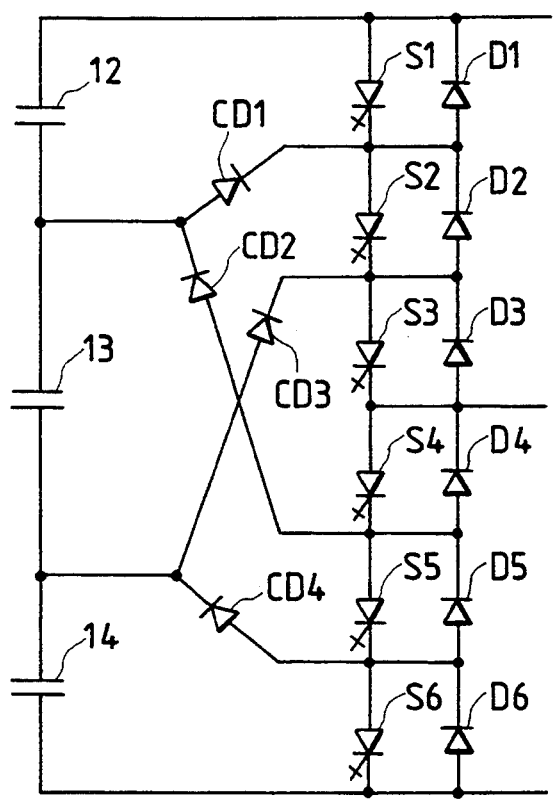
FIG. 17 is a constitutional diagram showing one phase portion in a main circuit of a multi-series inverter wherein six GTOs are connected in series in one arm to which the present invention is applied.

Hereinabove, examples of multi-series inverters wherein four GTOs are connected in series are explained, however in multi-series inverters wherein GTOs more than six are connected in series an incomplete on phenomenon is also caused. FIG. 17 shows one phase portion in a main circuit of a multi-series inverter wherein six GTOs connected in series. The operation of the circuit illustrated in FIG. 17 is explained in detail in JP-A-2-131370 (1990), therefore explanation thereof is omitted here. As in the circuit shown in FIG. 5, in the circuit shown in FIG. 17 an incomplete on phenomenon of the GTOs is caused under the following two conditions. The first one is caused under a condition that the GTOs S1, S2 and S3 are in an on condition and a load current is flowing through the flywheel diodes D1, D2 and D3 when the GTO S1 is turned off and the GTO S4 is turned on, and the other is caused under a condition that the GTOs S4, S5 and S6 are in an on condition and a load current is flowing through the flywheel diodes D4, D5 and D6 when the GTO S6 is turned off and the GTO S3 is turned on. In case of the former instance an incomplete on phenomenon may be caused at the GTOs S2 and S3, and in the latter instance such phenomenon may be caused at the GTOs S4 and S5. Accordingly, by selecting a larger gate current for the GTOs S2 through S5 than for the GTOs S1 and S6, such phenomenon is eliminated.

Further, in a multi-series inverter having more than eight serially connected GTOs for one arm such incomplete on phenomenon is likely eliminated by selecting a larger gate current for the GTOs other than the outer two GTOs.

Figure 18:
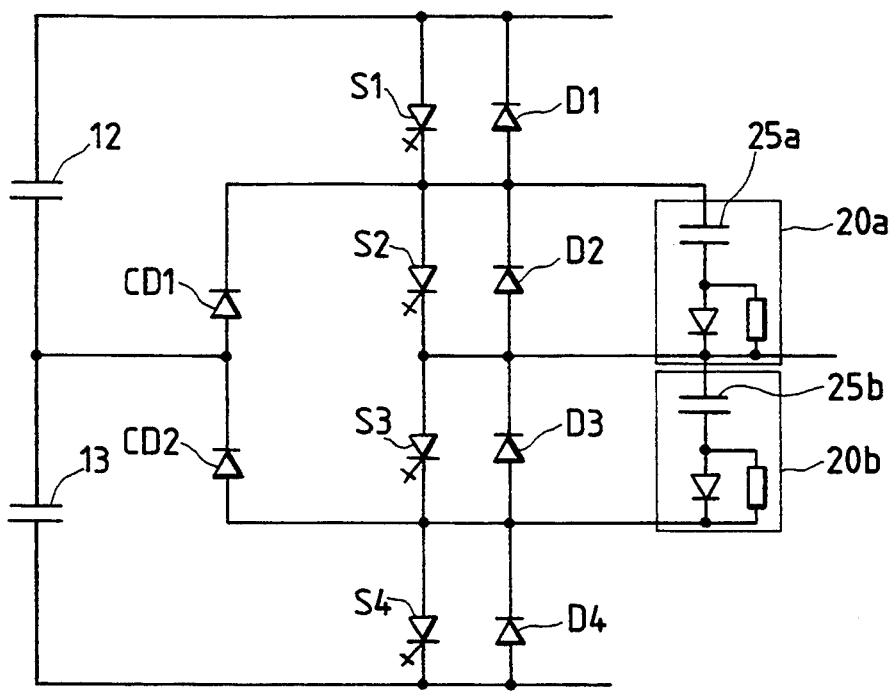
FIG. 18 is a schematic diagram of an embodiment of multi-series inverter arrangement according to the present invention.

FIG. 18 shows a seventh embodiment according to the present invention. In the circuit shown in FIG. 18, the capacitance of snubber capacitors 25a and 25b in snubber circuits 20a and 20b which are respectively connected with the GTOs S2 and S3 is selected to be larger than that in a conventional circuit. Now, when an incomplete on phenomenon is caused at the GTO S2 or S3 a current is bypassed toward a snubber capacitor 25a in the snubber circuit 20a or a snubber capacitor 25b in the snubber circuit 20b and a voltage induced at the GTOs is suppressed. Herein the capacitance of the snubber capacitors 25a and 25b is determined at such a magnitude that the voltage induced at the GTOs is suppressed below a voltage which never breaks-down the GTOs.

By increasing the capacitance of the snubber capacitor in such a manner that the voltage induced at the GTOs is reduced to be sufficiently small, breakdown of GTOs due to the incomplete on phenomenon is prevented without any modification of the conventional gate signal and gate driving current.

In the above embodiments, multi-series inverters using GTOs are exemplified, however in multi-series inverters using other switching elements such as transistors in place of the GTOs, substantially the same advantages can be obtained by increasing the gate current (in case of transistors the base current) in the same manner as explained. Further, when voltage drive type elements such as MOSFETs and IGBTs are used for the multi-series inverters, substantially the same advantages can be also obtained by increasing the gate voltage in the same manner as explained.

As explained above, in the multi-series inverter according to the present invention, even if a current begins to flow suddenly through a GTO to which an on signal is already applied but through which no current flows until then, no incomplete on phenomenon is caused at the GTO and the GTO continues to operate normally. Further, since the incomplete on phenomenon of the GTO is eliminated, breakdown of the GTO is prevented.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

We claim:

1. A multi-series inverter arrangement comprising:
   a DC circuit including a neutral point output terminal; and
   a multi-series inverter including three arms each for U, V and W phases connected in parallel with said DC circuit, each arm including:
   first, second, third and fourth switching elements connected in series, a mutual juncture point of said first and second switching elements and a mutual juncture point of said third and fourth switching elements are connected to the neutral point output terminal of said DC circuit via respective clamping diodes, and said first and third switching elements and said second and fourth switching elements are on and off controlled with each other in a conjugate relationship;
   flywheel diodes, each connected in parallel with said first, second, third and fourth switching elements; and
   individual gate driving circuits for said first, second, third and fourth switching elements for providing a gate current thereto,
   wherein, the gate current provided by said individual gate driving circuits for said second and third switching elements is determined to be larger than that provided by said individual gate driving circuits for said first and fourth switching elements.

2. A multi-series inverter arrangement according to claim 1, wherein among the gate current including a high gate drive forward current and a wide width gate forward current, the magnitude of the wide width gate forward current provided by said individual gate driving circuits for said second and third switching elements is determined larger than that provided by said individual gate driving circuit for said first and fourth switching elements.

3. A multi-series inverter arrangement comprising:
   a DC circuit including a neutral point output terminal; and
   a multi-series inverter including three arms each for U, V and W phases connected in parallel with said DC circuit, each arm including:
   first, second, third and fourth switching elements connected in series, a mutual juncture point of said first and second switching elements and a mutual juncture point of said third and fourth switching elements are connected to the neutral point output terminal of said DC circuit via respective clamping diodes, and said first and third switching elements and said second and fourth switching elements are on and off controlled with each other in a conjugate relationship;
   flywheel diodes, each connected in parallel with said first, second, third and fourth switching elements; and
   individual gate driving circuits for said first, second, third and fourth switching elements for providing a gate current thereto,
   wherein, the gate current provided by said individual gate driving circuits for said second and third switching elements is determined to be larger than that provided by said individual gate driving circuits for said first and fourth switching elements,
   wherein the gate current includes a high gate drive forward current and a wide width gate forward current following thereto, and said individual gate driving circuits for said second and third switching elements, each includes a first gate driving circuit for providing the high gate drive forward current, a second gate driving circuit for providing the wide width gate forward current and means for detecting a tendency of an incomplete on phenomenon at the corresponding switching element, said first gate driving circuit is activated when a turn on signal for the corresponding switching element is received or when said detecting means detects the tendency of an incomplete on phenomenon at the corresponding switching element and said second gate driving circuit is activated when the turn on signal for the corresponding switching element is received.

4. A multi-series inverter arrangement according to claim 3, wherein said detecting means determines a tendency of an incomplete on phenomenon at the corresponding switching element when a predetermined voltage between the anode and gate of the corresponding switching element is detected.

5. A multi-series inverter arrangement according to claim 3, wherein said detecting means determines a tendency of an incomplete on phenomenon at the corresponding switching element when a current between the anode and gate of the corresponding switching element is reduced to zero.

6. A multi-series inverter arrangement according to claim 3, wherein said detecting means determines a tendency of an incomplete on phenomenon at the corresponding switching element when a predetermined current begins to flow through the corresponding switching element.

7. A multi-series inverter arrangement according to claim 3, wherein said detecting means determines a tendency of an incomplete on phenomenon at the corresponding switching element when both turn on signals for second and third switching elements are received.

* * * * *